(12) United States Patent  
Singh et al.

(10) Patent No.: US 9,368,416 B2
(45) Date of Patent: Jun. 14, 2016

(54) CONTINUOUS VOLTAGE PRODUCT BINNING

(71) Applicant: Apple Inc., Cupertino, CA (US)

(72) Inventors: Preminder Singh, Belmont, CA (US); Date Jan Willem Noorlag, Seongnam-si (KR); Sung Wook Kang, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 566 days.

(21) Appl. No.: 13/868,540

(22) Filed: Apr. 23, 2013

(65) Prior Publication Data

US 2014/0316731 A1    Oct. 23, 2014

(51) Int. Cl.
  *G01N 37/00* (2006.01)
  *H01L 21/66* (2006.01)

(52) U.S. Cl.
  CPC ............... *H01L 22/20* (2013.01); *H01L 22/14* (2013.01)

(58) Field of Classification Search
  CPC ............... G01R 31/3004; G01R 31/14; G01R 31/2836; G01R 31/40; H01L 22/20; G05B 23/024

USPC .................... 702/57, 64, 65, 82, 84
See application file for complete search history.

(56) References Cited

U.S. PATENT DOCUMENTS

| | | | |
|---|---|---|---|
| 7,142,996 B2 | 11/2006 | Patel et al. | |
| 7,475,366 B2 | 1/2009 | Kuemerle et al. | |
| 8,421,495 B1 | 4/2013 | Anemikos et al. | |
| 9,157,956 B2 * | 10/2015 | Bickford | G01R 31/31718 |
| 2013/0124133 A1 | 5/2013 | Anemikos et al. | |

* cited by examiner

*Primary Examiner* — An Do
(74) *Attorney, Agent, or Firm* — Meyertons, Hood, Kivlin, Kowert & Goetzel, P.C.; Gareth M. Sampson; Lawrence J. Merkel

(57) ABSTRACT

A binning process uses curve fitting to create and assign one or more bins based on testing data of operating voltage versus leakage current for test integrated circuits. Each bin is created by assigning an initial operating voltage to the bin and fitting a curve to the testing data population. An equation is generated describing the fitted curve. Integrated circuits are binned by measuring the leakage current at a selected operating voltage and testing the integrated circuit at one or more operating voltages determined based on the fitted curves. The integrated circuits are assigned a maximum operating voltage that corresponds to the lowest tested operating voltage at which the integrated circuit passes the test.

20 Claims, 4 Drawing Sheets

CONTINUOUS VOLTAGE PRODUCT BINNING

BACKGROUND

1. Field of the Invention

The present invention relates to semiconductor devices and methods for testing semiconductor devices. More particularly, the invention relates to testing and binning of semiconductor devices such as integrated circuits.

2. Description of Related Art

Overall power consumption for semiconductor devices (e.g., semiconductor integrated circuits (ICs) such as logic or memory ICs) is a combination of dynamic (active) power consumption and static (leakage) power consumption. As devices have reduced in size and the power requirements (especially dynamic power requirements) have been reduced, static power consumption has become a more significant factor in overall power consumption for integrated circuits and semiconductor devices. Static power consumption is especially important in portable electronic devices as static (idle) power consumption directly affects battery life. Thus, the control and optimization of static power consumption is increasingly needed for the production of semiconductor devices used in portable electronic devices as well as other electronic devices.

Variations during the manufacturing of integrated circuits (e.g., variations during IC processing) may cause variation between integrated circuits that are manufactured to the same design specifications. For example, manufacturing variations such as, but not limited to, equipment variations, position on a wafer, process fluctuations, and/or operator variations may cause one or more parameters to vary between integrated circuits formed on the same wafer, integrated circuits formed in the same lot (batch), and/or integrated circuits formed on different wafers in different lots. Because of these manufacturing variations, integrated circuits with the same design may have different static power consumption characteristics. Using integrated circuits with excessive power consumption may lead to decreased battery life and/or decreased operational lifetime in electronic devices such as portable electronic devices. Thus, in order to maintain desired levels of battery life and/or operational lifetime, some integrated circuits may have to be "failed" because their static and/or dynamic power consumption is too high (e.g., power consumption that would lead to unacceptable battery life) and/or the voltage supplied to the integrated circuit may be limited to avoid excessive power consumption.

Binning of integrated circuits may be used to sort manufactured integrated circuits based on their static (or dynamic) power consumption. Post-manufacturing binning may be used to separate the manufactured integrated circuits into different bins based on worst-case static power consumption of each integrated circuit after testing of leakage currents in the integrated circuits at one or more voltage levels. Binning allows integrated circuits with higher static leakage currents to be accepted while maintaining the worst-case static power consumption at acceptable levels (e.g., by limiting the supply voltage provided to the integrated circuit). Binning the integrated circuits allows the integrated circuits to be sorted for use in selected products (e.g., selected portable electronic devices) based on the worst-case power consumption or maximum supply voltage for each bin. Binning of manufactured integrated circuits may produce better average power (static and/or dynamic) and better manufacturing yield, which reduces costs.

A drawback to binning is the time used to test and bin the integrated circuits after manufacturing the integrated circuits. Testing the integrated circuits at more voltages (e.g., bin voltages) requires more test time but can produce better average power and higher yield. Reducing the number of test voltages (bin voltages) to decrease test time, however, reduces average power and decreases yield. The number of bins used, therefore, may be a balance between time and desired power and/or yield. The number of bins may be reduced by tailoring the bins to more closely represent the population data.

SUMMARY

In certain embodiments, a process uses curve fitting for creating and assigning one or more bins to testing data of operating voltage versus leakage current for test integrated circuits. The test integrated circuits may include the same design, or a substantially similar design, to integrated circuits that will be used in one or more devices. One or more bins may be created by assigning an initial operating voltage to the testing data population and fitting a curve to the testing data population with a maximum operating voltage for the curve corresponding to the initial operating voltage. An equation may be generated to describe the fitted curve.

In certain embodiments, one or more integrated circuits are binned using the fitted curves and equations generated by the above described process. The leakage current of an integrated circuit may be measured at a selected operating voltage. The measured leakage current is used to determine one or more operating voltages for testing the integrated circuit. The testing operating voltages may be determined by using the equations describing the fitted curve(s) to determine the intersection(s) of the curve(s) with the measure leakage current. The integrated circuits are tested at one or more of the testing operating voltages and assigned a maximum operating voltage that corresponds to the lowest tested operating voltage at which the integrated circuit passes the test. In some embodiments, the integrated circuit is assigned to a bin based on the lowest tested operating voltage at which the integrated circuit passes the test.

In certain embodiments, an integrated circuit is programmed with one or more of the equations describing the fitted curve(s). The integrated circuit may include at least one fused leakage current value corresponding to its measured leakage current. The programmed equations and the fused leakage current value may be used to determine the operating voltage and frequency of the integrated circuit.

BRIEF DESCRIPTION OF THE DRAWINGS

Features and advantages of the methods and apparatus of the present invention will be more fully appreciated by reference to the following detailed description of presently preferred but nonetheless illustrative embodiments in accordance with the present invention when taken in conjunction with the accompanying drawings in which.

While the invention is susceptible to various modifications and alternative forms, specific embodiments thereof are shown by way of example in the drawings and will herein be described in detail. The drawings may not be to scale. It should be understood that the drawings and detailed description thereto are not intended to limit the invention to the particular form disclosed, but to the contrary, the intention is to cover all modifications, equivalents and alternatives falling within the spirit and scope of the present invention as defined by the appended claims.

DETAILED DESCRIPTION OF EMBODIMENTS

Figure 1:
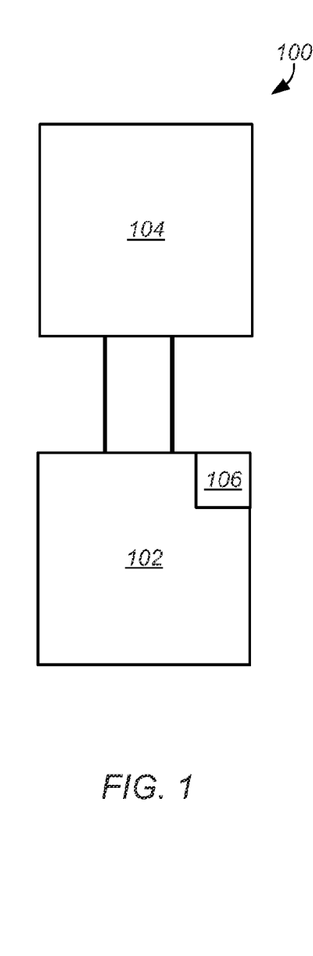
FIG. 1 depicts a schematic representation of an embodiment of a semiconductor device with an integrated circuit and a power supply.

FIG. 1 depicts a schematic representation of an embodiment of a semiconductor device with an integrated circuit and a power supply. Device 100 includes integrated circuit 102 and power supply 104. Integrated circuit 102 may be, for example, a memory or logic integrated circuit (die). In certain embodiments, integrated circuit 102 is a semiconductor based device. Integrated circuit 102 may be coupled to power supply 104. Power supply 104 provides a supply (operating) voltage to integrated circuit 102 for operation of the integrated circuit. Power supply 104 may, for example, provide power for logic and/or memory functions (operations) in integrated circuit 102 at one or more selected operating voltages.

In some embodiments, integrated circuit 102 is provided with more than one supply voltage. For example, integrated circuit 102 may include both logic and memory functions and operate at separate supply voltages for each function. The supply voltages for each function may be set at different values (e.g, the supply voltages are not identical). In some embodiments, power supply 104 provides power for each function of integrated circuit 102 (e.g., for both logic and memory functions). In some embodiments, one or more additional power supplies are used to provide power for additional functions in integrated circuit 102 (e.g., power supply 104 provides power for the logic function while another power supply provides power for the memory function).

In certain embodiments, integrated circuit 102 includes fuse block 106. Fuse block 106 may include one or more fuse programming circuits. In some embodiments, fuse block 106 includes one or more fuses programmed for responding to current (e.g., leakage current) in integrated circuit 102.

Figure 2:
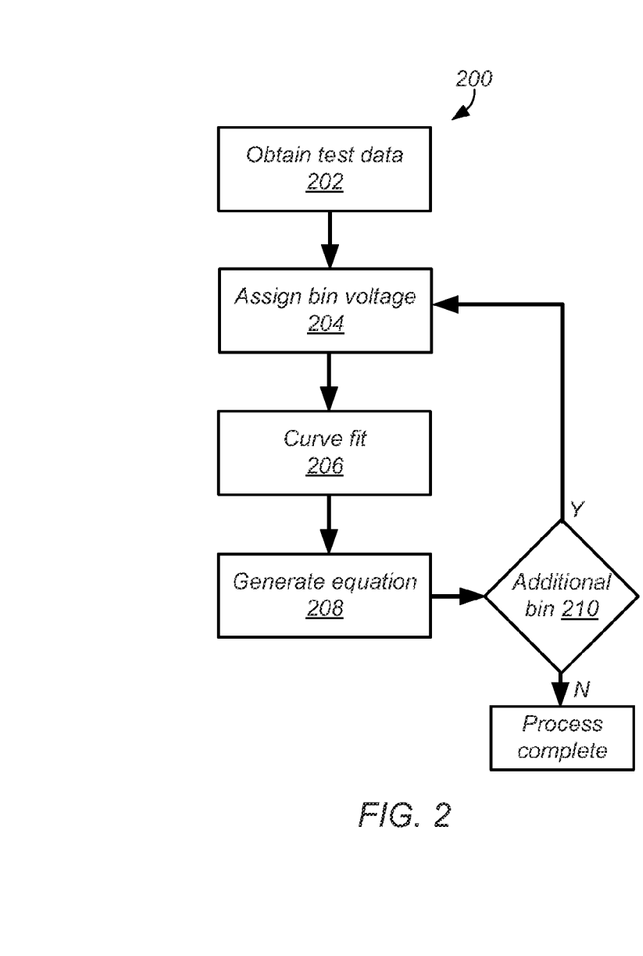
FIG. 2 depicts a flowchart of an embodiment for creating and assigning bins used for binning integrated circuits.

FIG. 2 depicts a flowchart of an embodiment for creating and assigning bins used for binning integrated circuits (e.g., integrated circuit 102). Process 200 for creating and assigning bins using testing data begins with "Obtain test data" 202. "Obtain test data" 202 includes obtaining testing data of operating voltage versus leakage current for one or more test integrated circuits. The test integrated circuits used for obtaining the testing data in 202 may be, for example, integrated circuits with a selected circuit design (e.g., a logic or memory circuit design). The selected circuit design may be the same design, or a substantially similar design, to a circuit design for integrated circuits that will be used in one or more devices (e.g., device 100).

Figure 3:
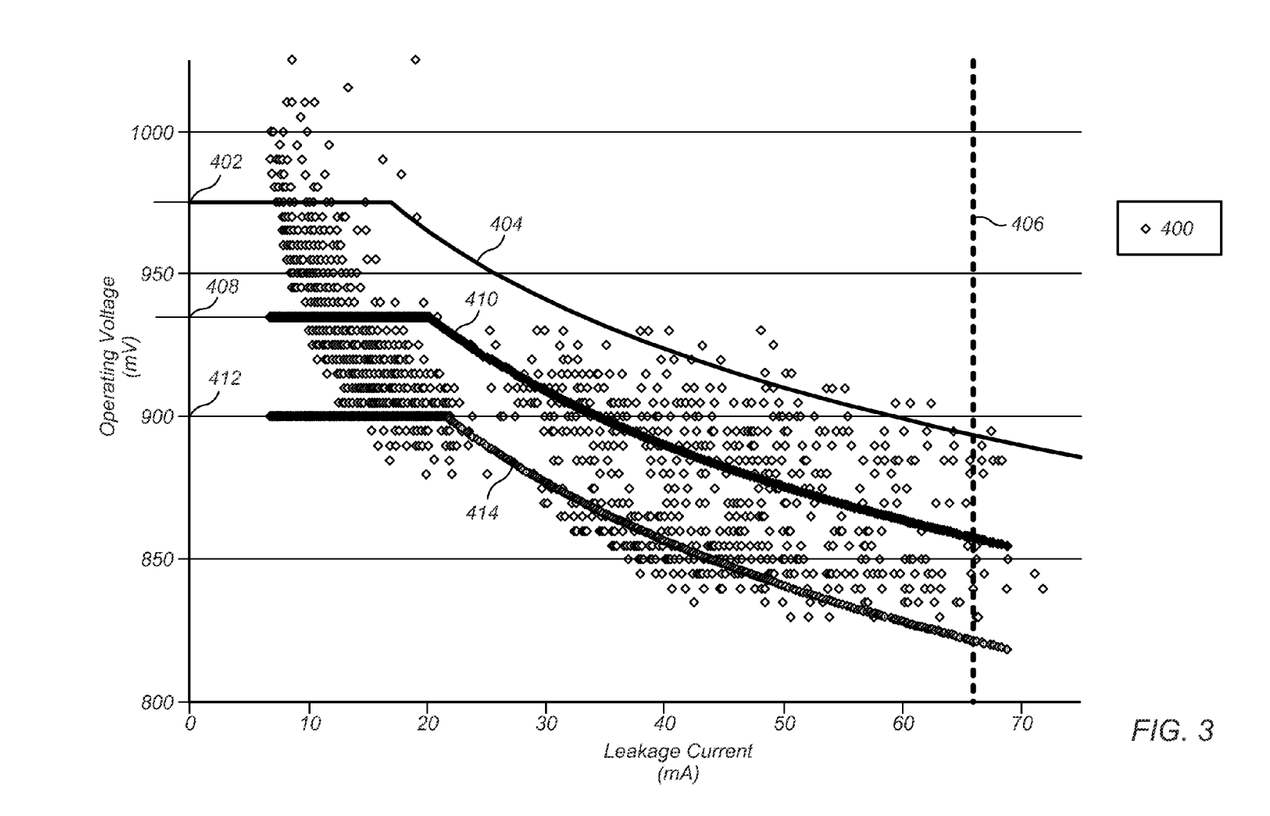
FIG. 3 depicts one embodiment of a plot of population testing data with operating voltage versus leakage current data.

Obtaining the testing data in 202 may include measuring leakage currents at a plurality of operating voltages provided to the test integrated circuits. Operating voltages that may be tested include, but are not limited to, logic supply voltage, memory supply voltage, and Input/Output supply voltage. The testing data then includes a "population" of operating voltage versus leakage current data for the selected circuit design. FIG. 3 depicts one embodiment of a plot of population testing data with operating voltage versus leakage current data 400 represented by diamond symbols.

After obtaining the testing data in 202, an initial bin operating voltage is assigned to the testing data in "Assign bin voltage" 204, as shown in FIG. 2. In 204, the initial bin operating voltage may be assigned based on a selected power output for the selected circuit design. The selected power output may be selected to correspond to operating characteristics of a desired device implementing the selected circuit design. For example, the selected power output may correspond to allowable static power drain in the desired device. The selected power output may be different based on the desired device implementing the selected circuit design. For example, certain devices may have larger batteries and, thus, may be able to withstand higher static power drain without adversely affecting battery life. In the embodiment of testing data shown in FIG. 3, initial bin voltage 402 is set at about 975 mV.

After assigning the initial bin operating voltage in 204, a curve may be fit to the testing data (e.g., data 400 in FIG. 3) in "Curve fit" 206, as shown in FIG. 2. In certain embodiments, the curve is fit to the testing data using the assigned initial bin voltage as a maximum operating voltage allowed for the curve. For example, as shown in FIG. 3, curve 404 is fit to data 400 with initial bin voltage 402 as the maximum operating voltage for the curve. Thus, curve 404 is fit to intercept a horizontal line representing initial bin voltage 402 at some point within the population of data 400. In some embodiments, the horizontal line representing initial bin voltage 402 becomes part of curve 404. Curve 404 may be fit using standard curve fitting operations (e.g., curve fitting algorithms or curve fitting software) known in the art. In some embodiments, curve 404 is fit using an exponential curve fitting operation. It is to be understood that curve 404 is not limited to an exponential curve fit or any typical curvature shape and that the curve may have any shape possible depending on the testing data population. For example, curve 404 may include one or more additional horizontal portions other than the horizontal line portion representing the initial bin voltage.

After fitting the curve in 206, an equation may be generated to describe the curve (e.g., curve 404 in FIG. 3) in "Generate equation" 208, as shown in FIG. 2. In certain embodiments, one equation is generated that describes both the horizontal line representing the initial bin voltage (e.g., initial bin voltage 402 in FIG. 3) and the curve fitting the data (e.g., curve 404 in FIG. 3). In some embodiments, more than one equation is generated to describe the curve. For example, one equation may describe the initial bin voltage while a second equation describes the curve.

In some embodiments, the equation is generated from curve fit data (e.g., the equation is fit to data that represents curve 404 and/or the horizontal line representing initial bin voltage 402, shown in FIG. 3). In certain embodiments, the equation describing the curve is generated during fitting of the curve. For example, an equation may be generated while fitting curve 404 to the testing data with initial bin voltage 402 set as the maximum voltage for the equation. The equation generated to describe curve 404 may be used later during testing and operation of an integrated circuit.

As shown in FIG. 3, curve 404, and the equation generated from the curve, is an upper boundary for a "bin" of integrated circuits. Thus, integrated circuits that have an operating voltage versus leakage current data point above curve 404 are considered to "fail" (e.g., static power consumption is too high) while integrated circuits that have an operating voltage versus leakage current data point below curve 404 are considered to "pass" (e.g., static power consumption is at an acceptable level).

Unlike rectangular bins, which are commonly used for binning integrated circuits, a bin created using curve 404 better represents the distribution in the testing data population. Creating the bin using curve 404 generates a bin that does not have a fixed voltage, unlike a rectangular bin, which has a fixed voltage based on the upper voltage limit of the bin. The bin using curve 404 has a voltage that varies with leakage current as described by the equation generated to describe the curve. Thus, the bin using curve 404, as shown in FIG. 3, has voltage values that decrease with increasing leakage current above a leakage current of about 18 mA.

Using curve 404 and the equation describing the curve to define the bin provides more accurate representation of the testing data population and may allow fewer bins to be used to cover the testing data population. Reducing the number of bins used to cover the testing data population may reduce test time while maintaining yield and average power for a batch of integrated circuits tested using the bins. In some embodiments, it may be possible to use only one bin to accurately describe the testing data population because of the variable voltage within the bin. In addition, having bins with variable voltage within the bin allows integrated circuits that are tested and binned using such bins to be operated at individual operating voltages defined by the equation describing the curve.

With rectangular bins, some later tested integrated circuits that are potentially acceptable can be failed because the square corners of the rectangular bins create "failure pockets" where acceptable power drain levels actually exist. Because curve 404 is fit to represent the population data, however, the bin created by the curve identifies integrated circuits in these pockets as acceptable integrated circuits. Additionally, rectangular bins have a tendency to capture (e.g., pass) integrated circuits that have test data that lie generally away from the actual testing data population. Though these integrated circuits are passed, these integrated circuits are generally unacceptable and prone to problems because they have operating characteristics that are largely different from the general population. Because curve 404 creates a bin that better represents the testing data population, however, such integrated circuits are failed during testing using the bin created by the curve.

In certain embodiments, an upper limit (shown by line 406 in FIG. 3) is also placed on the leakage current. The leakage current upper limit may be set, for example, to avoid leakage currents at unacceptable levels regardless of operating voltage. Thus, any integrated circuit with a leakage current above the upper limit line 406 will fail regardless of its operating voltage at that leakage current. The leakage current upper limit may be assigned at any point during process 200, shown in FIG. 2.

In some embodiments, more than one bin is assigned to the testing data obtained in 202, shown in FIG. 2. For example, more than one bin is used if integrated circuits using the selected circuit design can be used at more than one power drain level (e.g., more than one static power drain value). The selected circuit design may be useable at more than one power drain level if, for example, more than one product will use the integrated circuits with the selected circuit design. Assigning more bins to the testing data may produce better average power and higher yield. Typically, each additional bin is assigned at a different voltage so that there are multiple "voltage bins".

If more than one bin is to be created and assigned to the testing data, "Assign bin voltage" 204, "Curve fit" 206, and "Generate equation" 208 are repeated for each additional bin. As shown in FIG. 2, after the equation is generated in 208, "Additional bin" 210 poses the question of whether an additional bin is to be created and assigned to the testing data. If "Y", the process returns to "Assign bin voltage" 204 and the process is carried out for the additional bin. If "N", the process of assigning bins is completed.

The embodiments shown in FIG. 3 depicts two additional bins created and assigned to data 400. Initial bin voltage 408 at about 940 mV is used to fit curve 410 to data 400 and generate an equation describing the curve. Initial bin voltage 412 at about 900 mV is used to fit curve 414 to data 400 and generate an equation describing the curve. Thus, as shown in FIG. 3, three bins are created and assigned to data 400. A first bin is located below curve 404 and above curve 410; a second bin is located below curve 410 and above curve 414; and a third bin is located below curve 414. Using curve fitting (e.g., curves 404, 410, and 414) to define the bins provides more uniform power consumption within each bin because the bins have voltages that vary with leakage current. Thus, using the bins defined by the curves may provide better average power and better yield within each bin.

Figure 4:
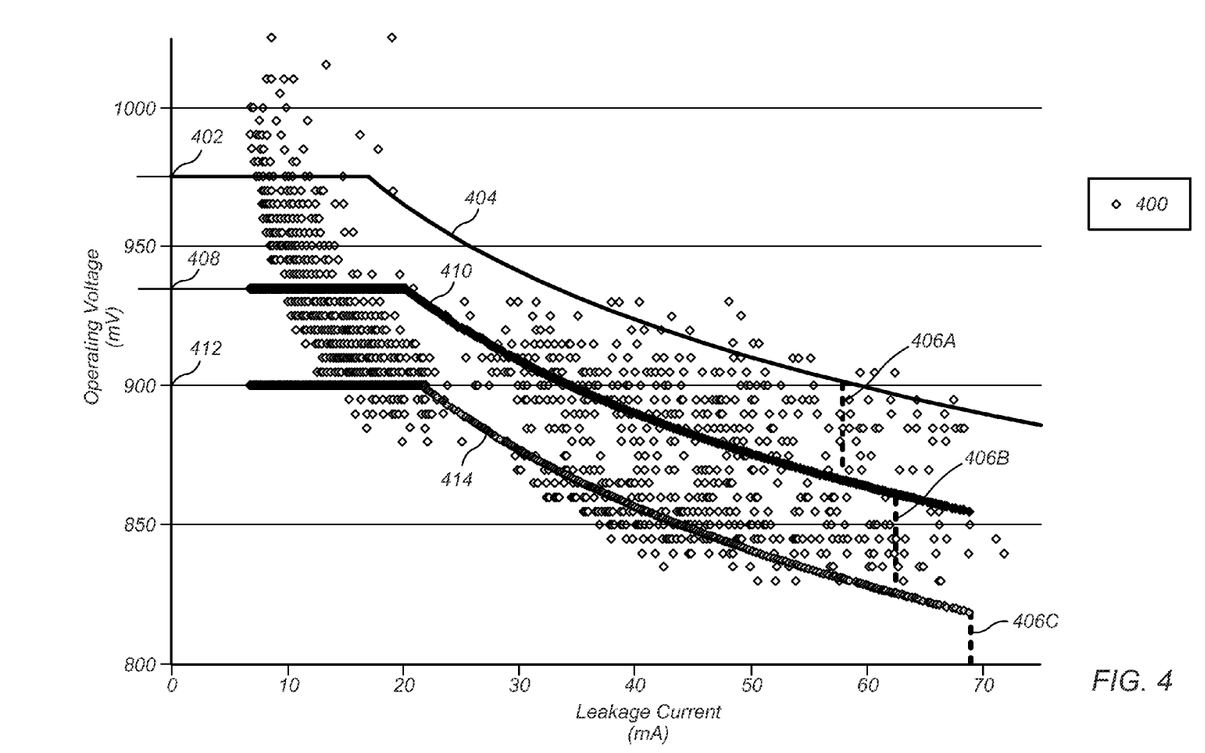
FIG. 4 depicts the plot of population testing data in FIG. 3 with different bins having different leakage current upper limits.

As shown in FIG. 3, all three bins share a common leakage current upper limit, shown by line 406. In some embodiments, each bin has a different leakage current upper limit. FIG. 4 depicts the plot of population testing data with the bins created and assigned in FIG. 3 with each bin having a different leakage current upper limit. Line 406A provides the leakage current upper limit for the bin located below curve 404 and above curve 410. Line 406B provides the leakage current upper limit for the bin located below curve 410 and above curve 414. Line 406C provides the leakage current upper limit for the bin located below curve 414. The different leakage current upper limits may be set at different values for each bin to improve average power for integrated circuits tested using the bins.

Figure 5:
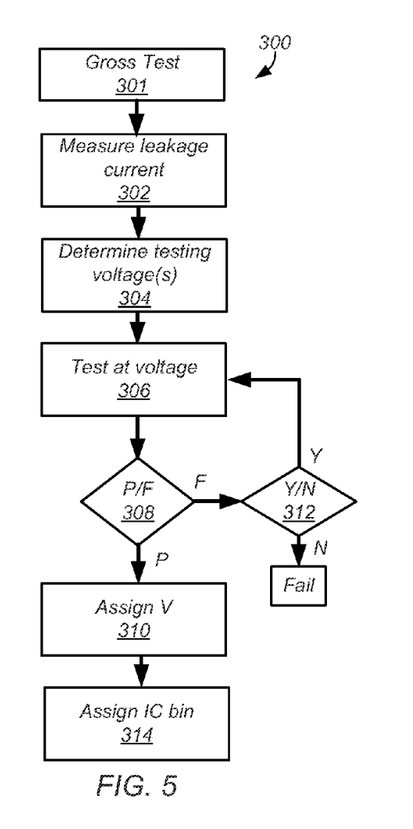
FIG. 5 depicts a flowchart of an embodiment of a binning process for binning integrated circuits.
Figure 6:
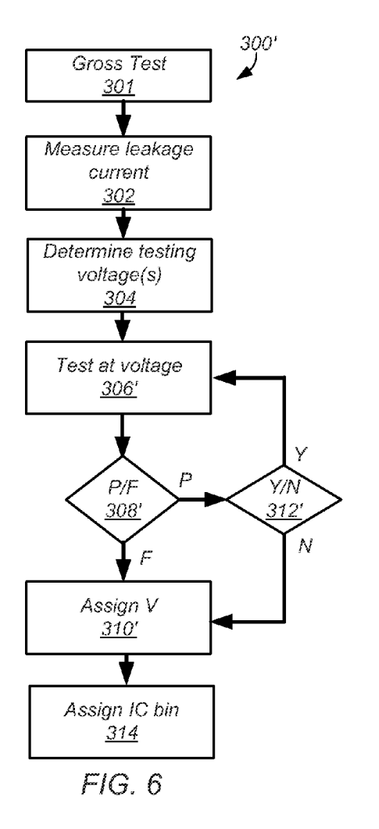
FIG. 6 depicts a flowchart of an alternative embodiment of a binning process for binning integrated circuits.

After one or more bins are created and assigned using process 200, shown in FIG. 2, the bins may be used for binning of one or more integrated circuits (e.g., testing and assigning the integrated circuits to one of the bins created). FIGS. 5 and 6 depict flowcharts of embodiments of binning process 300 and binning process 300' for binning integrated circuits with the bins created by process 200. The integrated circuits binned in process 300 or process 300' may have the same circuit design (e.g., the selected circuit design) or a substantially similar circuit design to the test integrated circuits used to create the bins in process 200.

Process 300 and process 300' may begin with testing for gross functionality of the integrated circuit at "Gross Test" 301. For example, open/short testing and/or scan testing for hard defects may be done at "Gross Test" 301. If the integrated circuit fails one of the gross functionality tests, the part may not proceed through any further testing and may be thrown away.

After gross functionality testing, process 300 and process 300' may continue with measuring the leakage current of an integrated circuit in "Measure leakage current" 302. In some embodiments, the leakage current may be measured at the highest operating voltage allowed for the selected circuit design. The leakage current may, however, be measure at any selected operating voltage (e.g., at any desired set value of the operating voltage). It is to be understood that process 300 may be used on a plurality of integrated circuits with each integrated circuit being processed through process 300. Thus, when more than one integrated circuit is binned using process 300, typically the leakage current is measured at the same selected operating voltage for each integrated circuit.

If the measured leakage current is above one or more of the leakage current upper limits (e.g., line 406 shown in FIG. 3 or lines 406A, 406B, 406C shown in FIG. 4), then the integrated circuit may not be tested at one or all of the operating voltages (e.g., the integrated circuit fails at an operating voltage if the measured leakage current is above the leakage current upper limit for the corresponding curve).

The measured leakage current for the integrated circuit may be used to determine the operating voltages at which the integrated circuit is to be tested in "Determine testing voltage(s)" 304. An operating voltage is determined from the equation describing the curve for each bin created during process 200. The number of voltages to be tested corresponds to the number of bins created during process 200. For example, if only one bin is created, then the integrated circuit may only be tested at one operating voltage determined by the curve fitted for the one bin and the integrated circuit is passed or failed based on only the one tested operating voltage. As another example, the embodiment shown in FIG. 3 has three bins and, thus, the integrated circuit may be tested at three different operating voltages determined by the curve fitted for each bin.

To determine the operating voltage in 304, the measured leakage current found in 302 is plugged into the equation for each curve created during process 200 (e.g, the intersection of the measured leakage current with each curve is found). For example, using the three bins represented by the fitted curves shown in FIG. 3, a measured leakage current of about 40 mA would provide three operating voltages for testing the integrated circuit: (a) about 920 mV from curve 404; (b) about 880 mV from curve 410; and (c) about 860 mV from curve 414. Each testing operating voltage corresponds to an intersection of the measured leakage current with each curve fitted to the testing data population. For example, 920 mV corresponds to the intersection of 40 mA with curve 404 in FIG. 3.

After determining the testing operating voltages in 304, the integrated circuit is tested at one of the testing operating voltages in "Test at voltage" 306, shown in FIG. 5, or "Test at voltage" 306', shown in FIG. 6. Testing the integrated circuit may include, but not be limited to, assessing one or more operating parameters of the integrated circuit at the tested operating voltage and passing or failing the integrated circuit based on the assessment of the operating parameters. FIG. 5 depicts a flowchart of an embodiment of binning process 300 for binning integrated circuits starting with the lowest testing operating voltage first. FIG. 6 depicts a flowchart of an alternative embodiment of binning process 300' for binning integrated circuits starting with the highest testing operating voltage first.

In process 300, shown in FIG. 5, at 306 testing begins with the lowest testing operating voltage determined in 304. At "P/F" 308, the integrated circuit is either passed or failed at the tested operating voltage. If the integrated circuit passes "P", the integrated circuit is assigned a maximum operating voltage corresponding to the test voltage at "Assign V" 310. If the integrated circuit fails "F", then the question is posed if there is another operating voltage for testing at "Y/N" 312. If "Y", then the integrated circuit is tested at another (higher) testing operating voltage in 306. If "N", then the integrated circuit is failed.

If the integrated circuit passes the test at the lowest tested operating voltage when the integrated circuit is tested at the lowest tested operating voltage first, the integrated circuit may not need to be tested at any other operating voltage because typically, it is desirable to run the integrated circuit at the lowest possible operating voltage. In addition, testing at fewer operating voltages reduces testing time. As an example, using the measured leakage current of 40 mA provided above, the integrated circuit may be tested at 860 mV first, and if the integrated circuit passes the test at that voltage, it would not be tested at either 880 mV or 920 mV. If the integrated circuit, however, failed the test at 860 mV, the integrated circuit would then be tested at 880 mV and then, if necessary, at 920 mV. As shown above, if the integrated circuit fails at all three voltages 860 mV, 880 mV, and 920 mV, then the integrated circuit is failed at 312 and is removed.

In process 300', shown in FIG. 6, at 306' testing begins with the highest testing operating voltage determined in 304. At "P/F" 308', if the integrated circuit passes "P", then the question is posed if there is another operating voltage for testing at "Y/N" 312'. If "Y", then the integrated circuit is tested at another (lower) testing operating voltage in 306'. If "N", then the integrated circuit is assigned the last testing operating voltage at "Assign V" 310'.

If the integrated circuit fails "F" at "P/F" 308' but has previously passed one or more tests at higher voltages, the integrated circuit is assigned the lowest passed testing operating voltage at "Assign V" 310'. In certain embodiments, if the integrated circuit fails its first test (e.g., the test at the highest voltage) at "P/F" 308', the integrated circuit is failed immediately (e.g., the integrated circuit is thrown out). Throwing away the failed integrated circuit after the first test reduces testing time as the integrated circuit is likely to fail the test at lower testing voltages. In some embodiments, if the integrated circuit fails its first test, the integrated circuit is retested at "Test at voltage" 306' beginning at the next highest voltage determined in 304. The integrated circuit may be retested at successive lower voltages until a highest passing test voltage is found. In some embodiments, if the integrated circuit fails its first test, the integrated circuit is tested using another binning process such as process 300, depicted in FIG. 5.

As an example of binning process 300', shown in FIG. 6, with the measured leakage current of 40 mA described above, the integrated circuit may be tested at 920 mV first. If the integrated circuit fails the test at 920 mV, the integrated circuit would be removed (thrown away). If the integrated circuit passes the test at 920 mV, it would then be tested at 880 mV. If the integrated circuit failed the test at 880 mV, the integrated circuit would then be assigned an operating voltage of 920 mV. If the integrated circuit passed the test at 880 mV, then the integrated circuit would be tested at 860 mV. If the integrated circuit failed the test at 860 mV, the integrated circuit would then be assigned an operating voltage of 880 mV. If the integrated circuit passed the test at 860 mV, then the integrated circuit would assigned an operating voltage of 860 mV (the last testing voltage).

In some embodiments, if process 300 (depicted in FIG. 5) or process 300' (depicted in FIG. 6) includes testing one or more integrated circuits for more than one bin, each integrated circuit may be assigned to a bin, at "Assign IC bin" 314, based on the lowest operating voltage at which that integrated circuit passed the test. The bins may, for example, be defined by curves 404, 410, and 414, as described above and shown in FIG. 3. Assigning each integrated circuit to a specific bin may allow each integrated circuit to be designated for a specific type of product or a specific type of use based on, for example, the average properties (e.g., power) of that bin.

At 310, an integrated circuit is assigned a maximum operating voltage that corresponds to the lowest operating voltage at which the integrated circuit passed the test. In certain embodiments, the integrated circuit is programmed with the maximum operating voltage based on the equation describing the curve for the lowest operating voltage at which the integrated circuit passed the test. For example, an integrated circuit such as integrated circuit 102 (shown in FIG. 1) may have a measured leakage current of about 40 mA at a selected operating voltage. Using the measured leakage current of 40 mA, the integrated circuit may be tested at operating voltages of 860 mV, 880 mV, and 920 mV using process 300, depicted in FIG. 5. If the integrated circuit fails the tests at 860 mV and 880 mV but passes the test at 920 mV, then the integrated circuit may be programmed with the equation that describes curve 404 (which provided the tested operating voltage of 920 mV).

In some embodiments, the equation describing the curve is programmed into the logic of the integrated circuit. In some embodiments, the equation describing the curve is programmed into a fuse block containing one or more fuses in the integrated circuit (e.g., fuse block 106, shown in FIG. 1). In certain embodiments, the measured leakage current is also programmed into the integrated circuit. The measured leakage current may be fused into the integrated circuit using, for example, fuse block 106, shown in FIG. 1.

With the equation describing the curve and the measured leakage current programmed into the integrated circuit (e.g, integrated circuit 102), device 100 may operate at an operating voltage determined using the equations and the measured leakage current. For example, with the leakage current fused into integrated circuit 102, the operating voltage for the integrated circuit may be determined using the equation describing the curve programmed into the integrated circuit (e.g., the integrated circuit calculates its operating voltage based on the fused leakage current value from the programmed equation). Thus, integrated circuit 102 may operate at the determined operating voltage, which is provided by power supply 104.

Programming the equations found from curve fitting of the testing data population into one or more integrated circuits and providing leakage current values into such integrated circuits (e.g., through fuse block 106) allows each integrated circuit to determine its own operating voltage within its assigned bin. Allowing each integrated circuit to determine its own operating voltage provides better average power and more efficient operating parameters for each bin as compared to rectangular binning, in which each integrated circuit in a bin is assigned the same operating voltage.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A method, comprising:
   measuring, using a test device, leakage currents of a plurality of integrated circuits at a plurality of operating voltages to obtain operating voltage versus leakage current data for the plurality of integrated circuits;
   assigning at least one initial bin operating voltage to the operating voltage versus leakage current data; and
   fitting a curve to the operating voltage versus leakage current data with a maximum operating voltage for the curve corresponding to the at least one initial bin operating voltage, wherein at least a portion of the curve describes operating voltage varying with leakage current.

2. The method of claim 1, wherein the at least one initial bin operating voltage is assigned based on a selected power output for one or more of the integrated circuits.

3. The method of claim 1, further comprising assigning a maximum leakage current to the curve.

4. The method of claim 1, further comprising fitting more than one curve to the operating voltage versus leakage current data with a maximum operating voltage for each curve corresponding to a different initial bin operating voltage.

5. The method of claim 4, wherein each initial bin operating voltage corresponds to a selected power output for one or more of the integrated circuits.

6. The method of claim 4, further comprising assigning a separate maximum leakage current to each curve.

7. The method of claim 1, further comprising generating an equation to describe the curve and programming one or more of the integrated circuits with the equation describing the curve.

8. A method, comprising:
   measuring, using a test device, a leakage current of an integrated circuit at a selected operating voltage;
   determining, in response to the measured leakage current, one or more operating voltages for testing the integrated circuit, wherein the operating voltages for testing the integrated circuit correspond to intersections of the measured leakage current and operating voltage along one or more curves that have been fitted to data of operating voltage versus leakage current for a plurality of test integrated circuits;
   testing the integrated circuit at at least one of the determined operating voltages to ensure correct functionality of the integrated circuit at the tested operating voltage; and
   assigning the integrated circuit a maximum operating voltage corresponding to a lowest tested operating voltage at which the integrated circuit passes the test.

9. The method of claim 8, wherein the plurality of test integrated circuits comprise a substantially similar design to the integrated circuit.

10. The method of claim 8, further comprising assigning the integrated circuit the maximum operating voltage by programming the integrated circuit with the measured leakage current and at least one equation corresponding to at least one of the fitted curves.

11. The method of claim 8, further comprising failing the integrated circuit if the integrated circuit does not pass the test at at least one of the tested operating voltages.

12. The method of claim 8, further comprising failing the integrated circuit if the measured leakage current is above a selected leakage current.

13. The method of claim 12, wherein the selected leakage current is different at each tested operating voltage.

14. The method of claim 1, wherein the portion of the curve that describes operating voltage varying with leakage current describes operating voltages below the maximum operating voltage.

15. A device, comprising:
an integrated circuit comprising logic relating operating voltage to leakage current, wherein the logic is generated from curve fitting of operating voltage versus leakage current data for a plurality of test integrated circuits; and
at least one leakage current value fused into the device, the fused leakage current value comprising a leakage current of the integrated circuit measured at a selected operating voltage, wherein the device operates at an operating voltage determined by the logic in response to the fused leakage current value.

16. The device of claim 15, wherein a maximum operating voltage for the curve fitting corresponds to a selected bin operating voltage for the device.

17. The device of claim 15, wherein the operating voltage comprises a logic supply voltage.

18. The device of claim 15, wherein the operating voltage comprises a memory supply voltage.

19. The device of claim 15, wherein the operating voltage comprises an Input/Output supply voltage.

20. The device of claim 15, wherein the logic is programmed into the integrated circuit using one or more fuse programming circuits in the integrated circuit.

* * * * *